(12) United States Patent
Lu et al.

(10) Patent No.: US 6,544,886 B2
(45) Date of Patent: *Apr. 8, 2003

(54) PROCESS FOR ISOLATING AN EXPOSED CONDUCTING SURFACE

(75) Inventors: Jiong-Ping Lu, Dallas, TX (US); Qi-Zhong Hong, Dallas, TX (US); Duane E. Carter, Plano, TX (US); Yung Liu, Dallas, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/574,731

(22) Filed: May 18, 2000

(65) Prior Publication Data

US 2002/0086522 A1 Jul. 4, 2002

Related U.S. Application Data

(60) Provisional application No. 60/140,890, filed on Jun. 24, 1999.

(51) Int. Cl.[7] .......................................... H01L 21/4763
(52) U.S. Cl. ................ 438/637; 438/635; 438/680; 438/687; 438/688; 438/768
(58) Field of Search ................................ 438/618, 622, 438/635, 637, 643, 653, 672, 675, 687, 688, 768, 627, 678–680; 148/276, 285, 537

(56) References Cited

U.S. PATENT DOCUMENTS

| | | | | | |
|---|---|---|---|---|---|
| 5,252,517 A | * | 10/1993 | Blalock et al. | .............. | 438/396 |
| 5,547,901 A | * | 8/1996 | Kim et al. | .................. | 438/652 |
| 5,627,102 A | * | 5/1997 | Shinriki et al. | ............. | 438/648 |
| 5,659,127 A | * | 8/1997 | Shie et al. | ................. | 73/31.05 |
| 5,766,379 A | * | 6/1998 | Lanford et al. | ............. | 148/537 |
| 5,817,572 A | * | 10/1998 | Chiang et al. | .............. | 438/624 |
| 5,936,293 A | * | 8/1999 | Parkin | ......................... | 257/422 |

* cited by examiner

*Primary Examiner*—Matthew Smith
*Assistant Examiner*—Craig P. Lytle
(74) *Attorney, Agent, or Firm*—Jacqueline J. Garner; W. James Brady, III; Frederick J. Telecky, Jr.

(57) ABSTRACT

A method of isolating an exposed conductive surface. An aluminum layer (130) is selectively formed over the exposed conductive (106) surface (e.g., Cu) but not over the surrounding dielectric (110) surface using a thermal CVD process. The aluminum layer (130) is then oxidized to form a thin isolating aluminum-oxide (108) over only the conductive surface. The isolating aluminum-oxide provides a barrier for the Cu while taking up minimal space and reducing the effective dielectric constant.

8 Claims, 2 Drawing Sheets

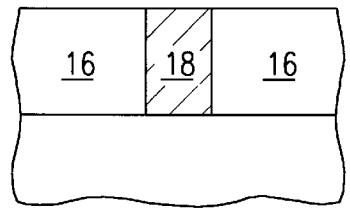
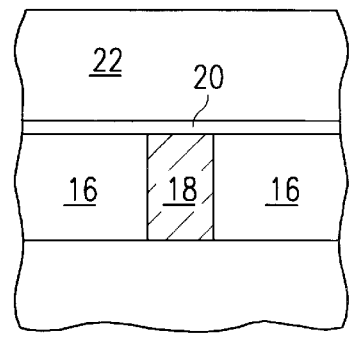
FIG. 1A
(PRIOR ART)
FIG. 1B
(PRIOR ART)
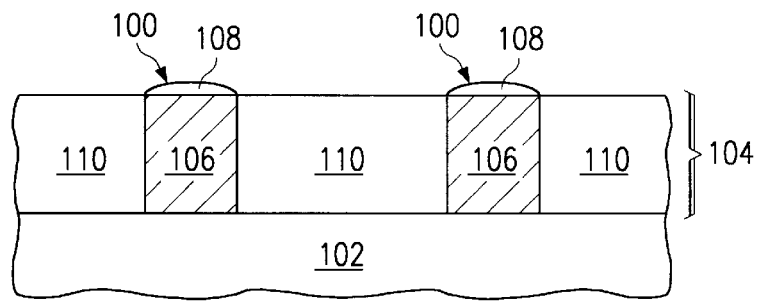
FIG. 2
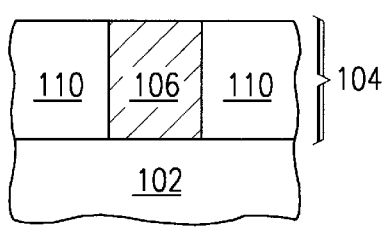
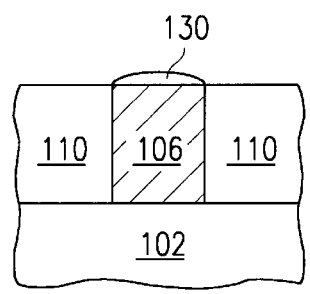
FIG. 3A
FIG. 3B
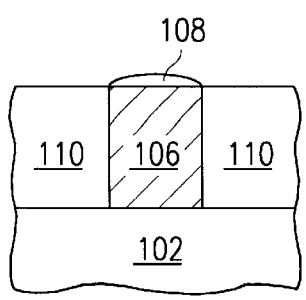
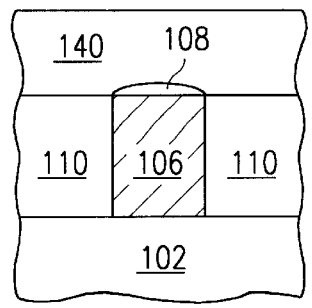
FIG. 3C
FIG. 3D

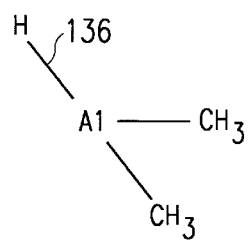
FIG. 4
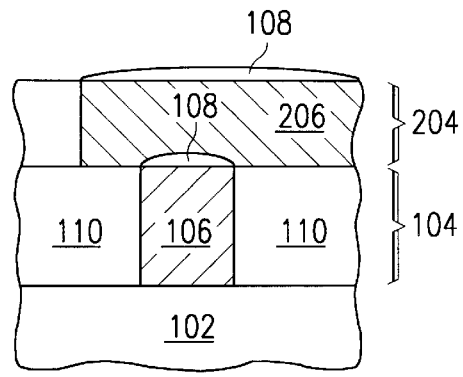
FIG. 5
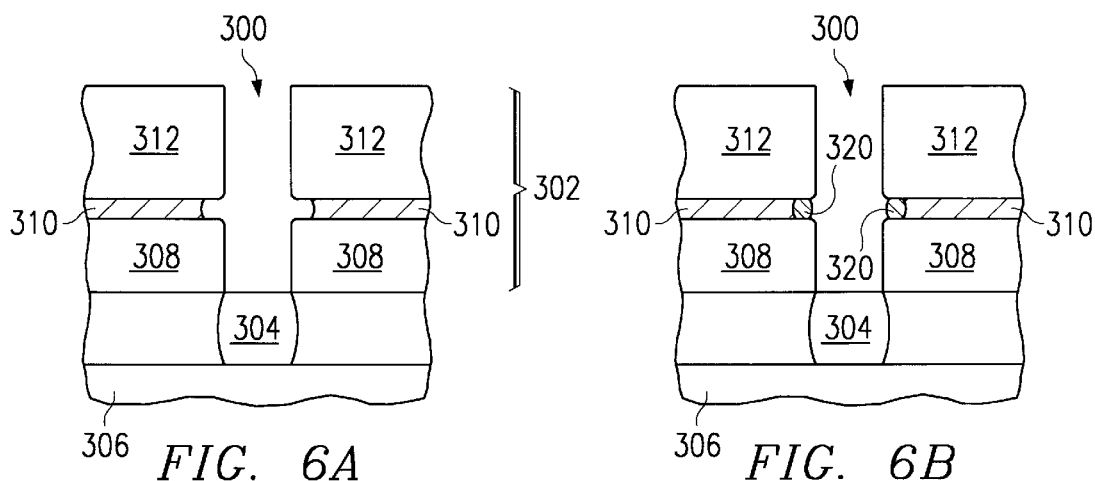
FIG. 6A
FIG. 6B
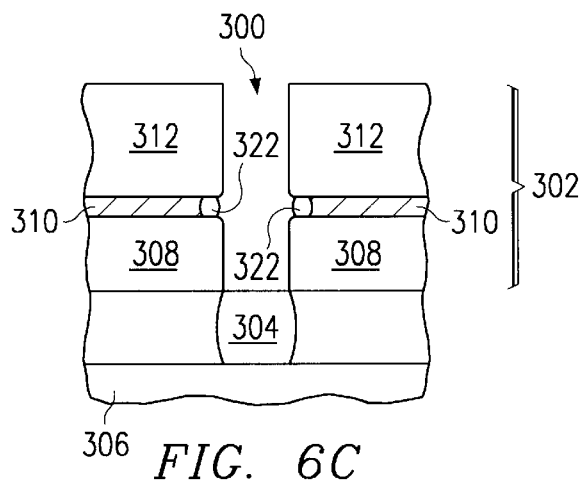
FIG. 6C

US 6,544,886 B2

PROCESS FOR ISOLATING AN EXPOSED CONDUCTING SURFACE

This application claims priority under 35 USC § 119(e)(1) of provisional application Ser. No. 60/140,890 filed Jun. 24, 1999, now abandoned.

FIELD OF THE INVENTION

The invention is generally related to the field of semiconductor devices and more specifically to isolating exposed conducting surfaces in semiconductor devices.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any barrier metals) are deposited, patterned, and etched to form the interconnect lines. Then, an intrametal dielectric (IMD) is deposited and planarized. In a damascene process, the IMD is formed first. The IMD is then patterned and etched. The barrier layer and a copper seed layer are then deposited over the structure. The copper layer is the formed using the seed layer over the entire structure. The copper is then chemically-mechanically polished (CMP'd) to remove the copper from over the IMD 16, leaving copper interconnect lines 18 as shown in FIG. 1A. A metal etch is thereby avoided.

Next, a silicon nitride layer 20 is deposited over the copper 18 and IMD 16, as shown in FIG. 1B. Copper must be surrounded by a barrier to prevent it from diffusing into the surrounding dielectric. An interlevel dielectric (ILD) 22 is then formed over the silicon nitride layer 20. Unfortunately, the silicon nitride layer increases the line-to-line capacitance by increasing the total effective dielectric constant of the interievel dielectric (ILD 22 and silicon nitride 20). Silicon nitride 20 also takes up voluble space that is needed for other essential device components.

SUMMARY OF THE INVENTION

The invention forms a thin aluminum-oxide on the surface of an exposed conducting surface. A selective aluminum deposition is used to deposit aluminum only on the conducting surface and not on the surrounding dielectric. The aluminum is then oxidized to form an isolation layer.

An advantage of the invention is providing an isolating film on a conducting surface but not a surrounding dielectric to minimize the space taken by the isolating film and/or reduce the effective dielectric constant.

This other advantages will be apparent to those of ordinary skill in the art having reference to the specification in conjunction with the drawings.

BRIEF DESCRIPTION OF THE DRAWINGS

In the drawings:

FIGS. 1A & 1B are cross-sectional diagrams of a prior art interconnect structure at various stages of fabrication;

FIG. 2 is a cross-sectional diagram of a interconnect having an isolated conducting surface according to the invention;

FIGS. 3A–3D are cross-sectional diagrams of the interconnect of FIG. 2 at various stages of fabrication according to the invention;

FIG. 4 is a diagram of a bond structure for $HAL(CH_3)_2$;

FIG. 5 is a cross-sectional diagram of the invention having a second interconnect formed thereover; and FIGS. 6A–6C are cross-sectional diagrams of the invention applied to isolate conductive layers exposed on a sidewall of a via at various stages of fabric.

DETAILED DESCRIPTION OF THE EMBODIMENTS

The invention will now be described in conjunction with a copper interconnect process. It will, however, be apparent to those of ordinary skill in the art that the benefits of the invention may be applied to other devices and processes that involve an exposed conducting surface over which a thin isolating layer is desired.

An isolated conducting surface 100 according to the invention is shown in FIG. 2. Semiconductor body 102 includes a substrate with transistors and other devices formed therein as desired. Interconnection between the transistors and other devices is accomplished via interconnect layer 104, Semiconductor body 102 may include a number of interconnect layers 104 to which the invention may be applied.

Interconnect layer 104 comprises a number of interconnect lines 106. Interconnect lines 106 comprise a metal, such as copper, with underlying barrier layers. The metal of interconnect line 106 is isolated at the surface by isolating layer 108. Isolating layer 108 comprises a thin aluminum-oxide ($Al_2O_3$). The aluminum oxide is on the order of 10–100 nm. Isolating layer 108 covers only the metal at the surface of interconnect line 106. It is not formed on the surface of the intrametal dielectric (IMD) 110.

The aluminum-oxide of isolating layer 108 provides a good, hard barrier. Even a very thin layer (e.g., 10–100 nm) provides sufficient electrical isolation. A good diffusion barrier is especially important for copper interconnects because copper easily diffuses into the surrounding dielectrics without a sufficient barrier.

A process for forming the isolated conducting surface 100 according to the invention will now be discussed with reference to FIGS. 3A–3D. Referring to FIG. 3A, semiconductor body 102 is processed through the formation of interconnect layer 104. This includes the formation of isolation structures, transistors and other devices (not shown). It further includes the formation of interconnect line 106 and IMD 110. As an example, a damascene or dual damascene process (as known in the art) may be used to form interconnect line 106 and IMD 110. In the preferred embodiment, copper with appropriate underlying barrier layers are used for interconnect line 106. Interconnect layer 104 may represent the first or any subsequent metal interconnect layer.

Referring to FIG. 3B, a selective deposition process is used to form a layer of aluminum 130 on the surface of interconnect line 106, but not on the surface of IMD 110. A selective CVD (chemical vapor deposition) process may be used. For selectivity between the metal and the dielectric, a precursor gas comprising aluminum and hydrogen may be used. For example, $HAl(CH_3)_2$ may be used. The bond structure for $HAl(CH_3)_2$ is shown in FIG. 4. The hydrogen-aluminum (H—Al) bond 136 is easier to break over metal at lower temperatures. The H—Al bond 136 will break over the dielectric, IMD 110, only at higher temperatures. Thus, a chemical comprising aluminum and hydrogen is appropriate for selective deposition of aluminum over a metal as opposed to a dielectric. Other suitable precursors include isopropyl aluminum and tert-butyle aluminum.

To ensure selectivity, the selective deposition process is carried out at low temperatures. For example, a temperature in the range of 150–200° C. may be used. Use of low temperatures makes the selective deposition process compatible with low-k materials. Low-k materials include xerogels, FSG (fluorine-doped silicate glass), HSQ, and organic low-k materials. Low-k materials are becoming more and more important for high performance integrated circuits to further reduce capacitance of interconnect lines. Accordingly, IMD 110 may comprise a low-k dielectric.

The selective deposition process can be performed in commercial reactors and is therefore easy to implement. Thermal CVD reactors are readily available.

Referring to FIG. 3C, the aluminum layer 130 is then subjected to an oxygen ambient to form aluminum oxide isolating layer 108. Aluminum is known to oxidize easily. Isolating layer 108 has a thickness on the order of 10–100 nm and is formed only over metal interconnect lines 106. The oxygen ambient may be an anneal in $O_2$ or $H_2O$. Alternatively, the oxygen ambient may be a plasma oxidation.

Next, an ILD 140 is deposited over the structure, as shown in FIG. 3D. ILD 140 may comprise a low-k dielectric if desired. The total effective dielectric constant of the dielectrics 110 and 140 is not reduced by the presence of a higher dielectric constant material between them as in the prior art silicon nitride approach. The dielectric constant is thus increased because isolating layer 108 is formed only over the conducting surface and not between the dielectrics 110 and 140.

As discussed above, the aluminum oxide of isolating layer 108 provides good protection for interconnect line 106. This is especially true if interconnect line 106 comprises copper. Aluminum oxide prevents copper from diffusing into ILD 140 even when very thin.

Another advantage of the invention is that the aluminum oxide of isolating layer 108 provides electrical isolation even when very thin. Accordingly, ILD 140 may be omitted and the subsequent interconnect layer 204 may be formed directly over interconnect layer 104, as shown in FIG. 5. Subsequent interconnect layer 104 comprises interconnect lines 206, similar to interconnect lines 106. The thin isolating layer 108 is sufficient for electrical isolation between interconnect lines 106 and interconnect lines 206.

After formation of isolating layer 108, subsequent interconnect layers, such as layer 204 of FIG. 5, may be formed as desired. As shown in FIG. 5, the invention may be applied to multiple interconnect layers (104, 204) in a device. The invention may be applied to one, several, or all of the interconnect layers of a device.

The invention may also be applied to other instances of exposed conducting surfaces. For example, the invention may be applied to isolate conductive layers exposed on a sidewall of a via. As shown in FIG. 6A, a via 300 is formed through a stack 302. Stack 302 comprises both dielectric layers 308, 312 and a conductive layer 310. Conductive layer 310 is shown as being recessed. It is desirable to isolate the conductive layer, without reducing the width of the via thereby increasing its aspect ratio.

In one DRAM device, the dielectric 308 comprises a cap oxide layer, a nitride layer, and a tantalum-pentoxide layer. Conductive layer 310 comprises a titanium-nitride layer, and dielectric layer 312 comprises a PETEOS oxide layer. In this DRAM device, via 300 extends through stack 302 to a polysilicon plug 304 at the substrate 306 surface.

The selective aluminum deposition process of the invention is used to form an aluminum layer 320 on the exposed surface of the conductive layer 310, as shown in FIG. 6B. As described above, a low temperature selective CVD process using a precursor comprising hydrogen and aluminum is used the precursor may, for example, comprise dimethylaluminum, isopropyl aluminum, or tert-butyle aluminum.

Aluminum layer 320 is then oxidized to form aluminum-oxide layer 322 as shown in FIG. 6C. Because aluminum layer 320 and aluminum-oxide layer 322 are formed only on the surface of the exposed conductive surface, the width of the via is not reduced and the aspect ratio is not increased.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
   providing a semiconductor body having a surface comprising both a conductive portion and a dielectric portion;
   selectively forming an aluminum layer over said conductive portion but not over said dielectric portion;
   oxidizing said aluminum layer to form an isolating layer over said conductive portion; wherein said surface comprises a via and said conductive portion is located on a sidewall of said via.

2. The method of claim 1, wherein said selectively forming step comprises a thermal chemical vapor deposition at a temperature less than 200° C.

3. The method of claim 1, wherein said selectively forming step uses a precursor comprising hydrogen and aluminum.

4. The method of claim 1, wherein said selectively forming step uses a precursor comprising dimethylaluminum.

5. The method of claim 1, wherein said oxidizing step comprises an anneal in $O_2$.

6. The method of claim 1, wherein said oxidizing step comprises an anneal in $H_2O$.

7. The method of claim 1, wherein said oxidizing step comprises a plasma oxidation.

8. A method of forming an integrated circuit, comprising the steps of:
   forming a dielectric layer over a semiconductor body;
   forming a first interconnect line within said dielectric layer;
   selectively depositing by chemical vapor deposition an aluminum layer over said first interconnect line but not over said dielectric layer;
   oxidizing said aluminum layer to form an isolating layer over said first interconnect line; and
   forming a second interconnect line over said dielectric layer and said first interconnect line, wherein at least a portion of said second interconnect line is electrically isolated from said first interconnect line by only said isolating layer.

* * * * *